US012603665B2

(12) United States Patent
Chou

(10) Patent No.: US 12,603,665 B2
(45) Date of Patent: Apr. 14, 2026

(54) TRANSMITTER AND RELATED GAIN CONTROL METHOD

(71) Applicant: REALTEK SEMICONDUCTOR CORPORATION, Hsinchu (TW)

(72) Inventor: Chien-I Chou, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 382 days.

(21) Appl. No.: 18/318,450

(22) Filed: May 16, 2023

(65) Prior Publication Data

US 2023/0412201 A1 Dec. 21, 2023

(30) Foreign Application Priority Data

Jun. 15, 2022 (TW) .................................. 111122262

(51) Int. Cl.
| | |
|---|---|
| *H04B 1/04* | (2006.01) |
| *H03F 1/02* | (2006.01) |
| *H03F 3/24* | (2006.01) |

(52) U.S. Cl.
CPC ......... *H04B 1/0483* (2013.01); *H03F 1/0222* (2013.01); *H03F 3/245* (2013.01); *H04B 2001/0416* (2013.01)

(58) Field of Classification Search
CPC .......... H04B 1/0483; H04B 2001/0416; H03F 1/0222; H03F 3/245; H03F 2200/447;
(Continued)

(56) References Cited

U.S. PATENT DOCUMENTS

| | | | | |
|---|---|---|---|---|
| 5,977,831 A | * | 11/1999 | Davis ................... | H03G 3/3042 330/129 |
| 2005/0237110 A1 | * | 10/2005 | Parkhurst ............. | H03G 3/3042 330/140 |

(Continued)

FOREIGN PATENT DOCUMENTS

TW          I739713 B          9/2021

OTHER PUBLICATIONS

Carrara, F., Presti, C. D., Scuderi, A., Santagati, C., & Palmisano, G. (2008). A methodology for fast VSWR protection implemented in a monolithic 3-W 55% PAE RF CMOS power amplifier. IEEE Journal of Solid-State Circuits, 43(9), 2057-2066. https://doi.org/10.1109/jssc.2008.2001894.

(Continued)

*Primary Examiner* — Don N Vo
(74) *Attorney, Agent, or Firm* — WPAT, P.C.; Anthony King

(57)          ABSTRACT
A transmitter includes an analog transmission circuit, a power amplifier, a voltage detector, a comparator, and a control circuit. The analog transmission circuit is configured to provide a first gain to a first analog signal, so as to generate a second analog signal. The power amplifier is configured to provide a second gain to the second analog signal, so as to generate an output signal to an antenna. The voltage detector is configured to detect a voltage level of the second analog signal. The comparator is configured to generate an indication signal according to the voltage level and a reference level. The control circuit is configured to adjust the first gain of the analog transmission circuit according to the indication signal.

18 Claims, 2 Drawing Sheets

(58) Field of Classification Search
CPC ...... H03F 2200/468; H03F 1/52; H03F 3/195;
H03G 3/3042
USPC ............................... 455/127.1; 375/296, 297
See application file for complete search history.

(56) References Cited

U.S. PATENT DOCUMENTS

| | | | |
|---|---|---|---|
| 2007/0153937 A1* | 7/2007 | Itkin | H03G 3/3047 |
| | | | 375/297 |
| 2010/0015937 A1* | 1/2010 | Yang | H03G 3/3068 |
| | | | 455/253.2 |
| 2010/0173597 A1 | 7/2010 | Behzad | |
| 2011/0043956 A1 | 2/2011 | Su et al. | |
| 2013/0142225 A1* | 6/2013 | Ko | H04W 52/36 |
| | | | 375/219 |
| 2016/0241295 A1* | 8/2016 | Lyalin | H03F 1/22 |
| 2016/0261239 A1* | 9/2016 | Khesbak | H03G 3/3042 |

OTHER PUBLICATIONS

English brief translation of TWI739713B, Sep. 11, 2021.

* cited by examiner

TRANSMITTER AND RELATED GAIN CONTROL METHOD

CROSS-REFERENCE TO RELATED APPLICATIONS

This application claims the benefit of priority to patent application Ser. No. 11/122,262, filed in Taiwan on Jun. 15, 2022, which is incorporated by reference in its entirety.

TECHNICAL FIELD

The present application relates to a transmitter and a related gain control method, particularly to a transmitter and a related gain control method for preventing the power amplifier from damage.

BACKGROUND

In wireless communication system, the signal strength is related to the communication quality. However, the signal strength must fall within the acceptable range of the apparatus so as to prevent the apparatus from damage. Therefore, how to generate an appropriate signal strength is an important issue in this field.

SUMMARY OF THE INVENTION

An aspect of the present disclosure provides a transmitter includes an analog transmission circuit, a power amplifier, a voltage detector, a comparator, and a control circuit. The analog transmission circuit is configured to provide a first gain to a first analog signal, so as to generate a second analog signal. The power amplifier is configured to provide a second gain to the second analog signal, so as to generate an output signal to an antenna. The voltage detector is configured to detect a voltage level of the second analog signal. The comparator is configured to generate an indication signal according to the voltage level and a reference level. The control circuit is configured to adjust the first gain of the analog transmission circuit according to the indication signal.

Another aspect of the present disclosure provides a gain control method configured to control a first gain of an analog transmission circuit and a second gain of a power amplifier in a transmitter. The analog transmission circuit provides the first gain to a first analog signal so as to generate a second analog signal, and the power amplifier provides the second gain to the second analog signal so as to generate an output signal. The method includes adjusting the first gain and the second gain according to a voltage level of the second analog signal, a power of the output signal and a temperature of the transmitter including: generating an indication signal according to the voltage level and a reference level; and adjusting the first gain according to the indication signal. The output signal is outputted through an antenna of the transmitter.

Compared with conventional technology, the transmitter and the related gain control method of the present disclosure can avoid the power amplifier from receiving signals with too much energy so as to protect the power amplifier from damage.

BRIEF DESCRIPTION OF THE DRAWINGS

Various aspects of the present application can best be understood upon reading the detailed description below and accompanying drawings. It should be noted that the various features in the drawings are not drawn to scale in accordance with standard practice in the art. In fact, the size of some features may be deliberately enlarged or reduced for the purpose of discussion.

DETAILED DESCRIPTION

Figure 1:
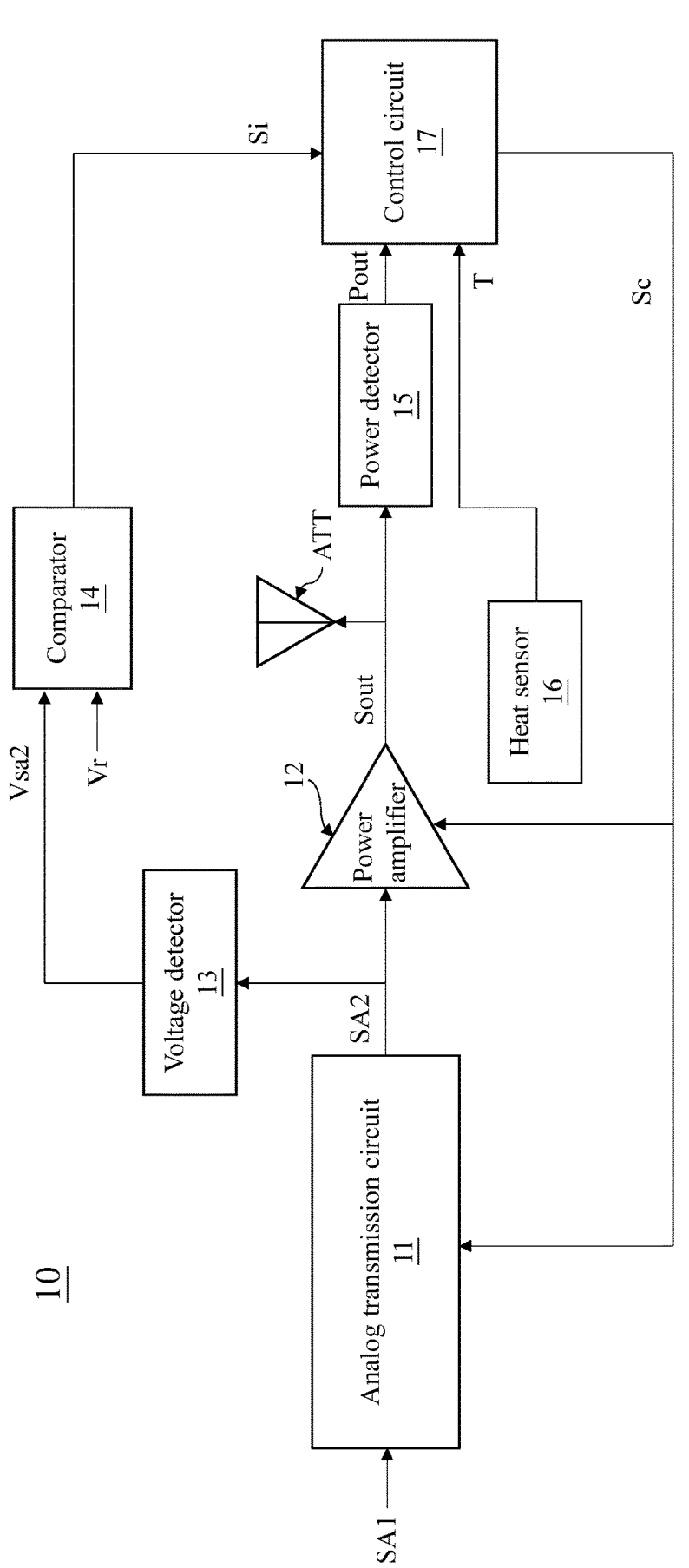
FIG. 1 is a schematic diagram illustrating a transmitter according to some embodiments of the present disclosure.

FIG. 1 is a schematic diagram illustrating a transmitter 10 according to some embodiments of the present disclosure. For example, the transmitter 10 can be used in Wi-Fi wireless communication to generate a transmission signal (e.g., the output signal Sout of FIG. 1) and send the transmission signal out through the antenna ATT to be received by the transceiver of another communication apparatus (not shown in the drawings). During the transmission, the transmitter 10 can adjust the power of the output signal Sout, so as to make the output signal Sout match the required power level at the antenna ATT. Generally, the transmission apparatus focuses on the level of the power of the output signal. However, in some advanced processes, such as those below 22 nm, before the output signal is adjusted to the desired power level, the input terminal of the power amplifier in the transmission apparatus may be damaged by receiving a signal with too large power. Therefore, the present disclosure provides the transmitter 10 and the related gain control method 20 to avoid the above issue.

For simplicity, FIG. 1 shows only some of the components of the transmitter 10, whereas the rest of the components not shown can be similar to conventional transmitters, and the configurations and operations of those components are not described herein.

The transmitter 10 includes an analog transmission circuit 11, a power amplifier 12, a voltage detector 13, a comparator 14, a power detector 15, a heat sensor 16, a control circuit 17 and an antenna ATT. In some embodiments, the control circuit 17 is a baseband processing circuit of the transmitter 10.

The analog transmission circuit 11 is configured to receive an analog signal SA1 (for example, the analog signal generated by a digital-to-analog converter), and provide a gain G1 to the analog signal SA1 so as to generate an analog signal SA2. The power amplifier 12 is configured to provide a gain G2 to the analog signal SA2 so as to generate the output signal Sout to the antenna ATT. The voltage detector 13 is configured to detect a voltage level Vsa2 of the analog signal SA2. The comparator 14 is configured to compare the voltage level Vsa2 and a reference level Vr to generate an indication signal Si. The power detector 15 is configured to detect the power Pout of the output signal Sout. The heat sensor 16 is configured to detect the temperature T of the transmitter 10. The indication signal Si, the power Pout and the temperature T are respectively transmitted to the control circuit 17, and the control circuit 17 generates a control signal Sc accordingly, which is configured to adjust the gain G1 and/or G2. In some embodiments, the reference level Vr may have different values for different power amplifiers 12. In some embodiments, the heat sensor 16 is configured to detect the temperature of a device that is sensitive to the temperature T, such as the temperature of the power amplifier 12.

When the power Pout of the output signal Sout determined by the power detector 15 is greater than a pre-determined threshold power Pth, the control circuit 17 generates a control signal Sc to decrease the gain G1 of the analog transmission circuit 11, such that the power Pout of the output signal Sout is lower than and closed to the threshold power Pth.

In further embodiments, when decreasing the gain G1 alone is not sufficient to bring the power Pout below the threshold power Pth, the control circuit 17 further decreases the gain G2 of the power amplifier 12.

In some embodiments, the control circuit 17 further controls the gain G1 and the gain G2 according to the indication signal Si. When the voltage level Vsa2 of the analog signal SA2 is greater than the reference level Vr, the comparator 14 generates the indication signal Si having a first level. When the voltage level Vsa2 of the analog signal SA2 is not greater than the reference level Vr, the comparator 14 generates the indication signal Si having a second level. In some embodiments, the first level and the second level are respectively "1" and "0" of digital signals.

When the indication signal Si has the first level, it means that the power of the analog signal SA2 is too high and may damage the input terminal of the power amplifier 12. In this case, regardless of the power Pout of the output signal Sout, the control circuit 17 needs to protect the power amplifier 12 from being damaged first. Therefore, the control circuit 17 reduces the gain G1 of the analog transmission circuit 11 to reduce the power of the analog signal SA2, thereby protecting the power amplifier 12. In some embodiments, when the control circuit 17 reduces the gain G1, the gain G1 is decreased by about 7 dB.

In contrast, when the indication signal Si has the second level, it means that the power of the analog signal SA2 is not yet sufficient to damage the input terminal of the power amplifier 12. If, at this time, the power Pout of the output signal Sout is not greater than the threshold power Pth, the control circuit 17 increases the gain G1 to increase the power of the analog signal SA2. In some embodiments, the control circuit 17 increases the gain G2 to increase the power Pout of the output signal Sout.

In some embodiments, the temperature T of the transmitter 10 affects the gain G2 of the power amplifier 12. For example, the gain G2 shifts when the temperature T changes. Thus, the control circuit 17 further controls the gain G1 and the gain G2 according to the temperature T.

Generally speaking, the average powers of analog signals with different modulation methods do not have a fixed relationship with their peak voltage levels. Similarly, the analog signals SA2 with different modulation methods may have the same peak voltage, but different average power. In the present disclosure, the voltage detector 13 detects the peak voltage level of the analog signal SA2, while the power detector 15 detects the average power of the output signal Sout. Thus, in some embodiments, the control circuit 17 controls gain G1 and gain G2 in accordance with the modulation method of analog signal SA2 (i.e., the modulation method of the output signal Sout). In some embodiments, the control circuit 17 is used to obtain the peak-to-average power ratio (PAPR) of the output signal Sout (or the analog signal SA2), which may represent the modulation method of the output signal Sout (or the analog signal SA2).

In some embodiments, the control circuit 17 obtains the amount of adjustment required for the gain G1 and the gain G2 in accordance with Equation 1:

$$Psa2p-Pout=-(G2)+Gtx+\Delta GT+PAPR \qquad \text{(Equation 1)}.$$

In Equation 1, $Psa2p$ is the peak power of the analog signal SA2; Gtx is the amount of adjustment required for the overall gain of the transmitter 10; and ΔGT is the amount of offset by which the gain G2 is shifted as a result of the temperature T. In Equation 1, the units of the peak power $Psa2p$ and the power Pout are dBm, such that the units on the left side of Equation 1 become dB after the peak power $Psa2p$ and the power Pout are subtracted. In this way, the units of gain G2, the required amount of adjustment Gtx, the offset ΔGT and the peak-to-average power ratio PAPR in Equation 1 are dB.

The control circuit 17 is configured to obtain the current gain G2, the peak power $Psa2p$ of the analog signal SA2, and the peak-to-average power ratio PAPR of the output signal Sout, followed by obtaining the power Pout through the power detector 15, and obtaining the offset ΔGT of the gain G2 based on the temperature T detected by the heat sensor 16. After bringing the parameters $Psa2p$, Pout, G2, ΔGT, and PAPR into Equation 1, the control circuit 17 obtains the amount of adjustment Gtx required for the overall gain of transmitter 10. In some embodiments, the control circuit 17 allocates the adjustment amount Gtx to the analog transmission circuit 11 and the power amplifier 12, i.e., the sum of the adjustment amount of the gain G1 and the adjustment amount of the gain G2 is the adjustment amount Gtx. In some embodiments, the control circuit 17 allocates only the adjustment amount Gtx to the analog transmission circuit 11, i.e., the adjustment amount of gain G1 is equal to the adjustment amount Gtx, whereas the adjustment amount of gain G2 is approximately equal to zero. Specifically, the control circuit 17 determines the energy level of the analog signal SA2 according to the specification of the power amplifier 12. In some embodiments, the control circuit 17 can increase the gain G1 as much as possible under the premises that it does not damage the power amplifier 12.

In some embodiments, the control circuit 17 is further configured to control the peak power $Psa1p$ of the analog signal SA1 below a pre-determined power upper limit Pup to protect the power amplifier 12 from being damaged by the energy of the analog signal SA2. In this case, the control circuit 17 uses Equation 2 to control the peak power $Psa1p$ of the analog signal SA1.

$$Psa1p=Pout-(G1+G2)+Gtx+\Delta GT+PAPR \qquad \text{(Equation 2)}.$$

In Equation 2, $Psa1p$ is the peak power of the analog signal SA1. When the transmitter 10 is activated, the control circuit 17 determines an initial value P0 of the pre-determined power upper limit Pup. When the indication signal Si has the first level, it means that the voltage level Vsa2 of the analog signal SA2 is too high (greater than the reference level Vr), and the control circuit 17 sets the power of the analog signal SA2 to be the pre-determined power upper limit Pup. When the indication signal Si has the second level, it means that the voltage level Vsa2 of the analog signal SA2 is not greater than the reference level Vr, and the control circuit 17 does not update the setting of the pre-determined power upper limit Pup.

After the gain G1 and the gain G2 are adjusted according to Equation 1, the control circuit 17 determines whether the peak power $Psa1p$ of the analog signal SA1 is greater than the updated pre-determined power upper limit Pup via Equation 2. In some embodiments, the control circuit 17 is configured to decrease the peak power $Psa1p$ of the analog signal SA1. For example, the control circuit 17 controls the gain of the digital-to-analog convertor generating the analog signal SA1. As could be appreciated, the present disclosure is not limited thereto, and various operations capable of decreasing the peak power Psa1$p$ of the analog signal SA1 are all within the contemplated scope of the present disclosure.

In some embodiments, the control circuit 17 is configured to reset the pre-determined power upper limit Pup to the initial value P0 when the temperature T of the transmitter 10 changes drastically.

Figure 2:
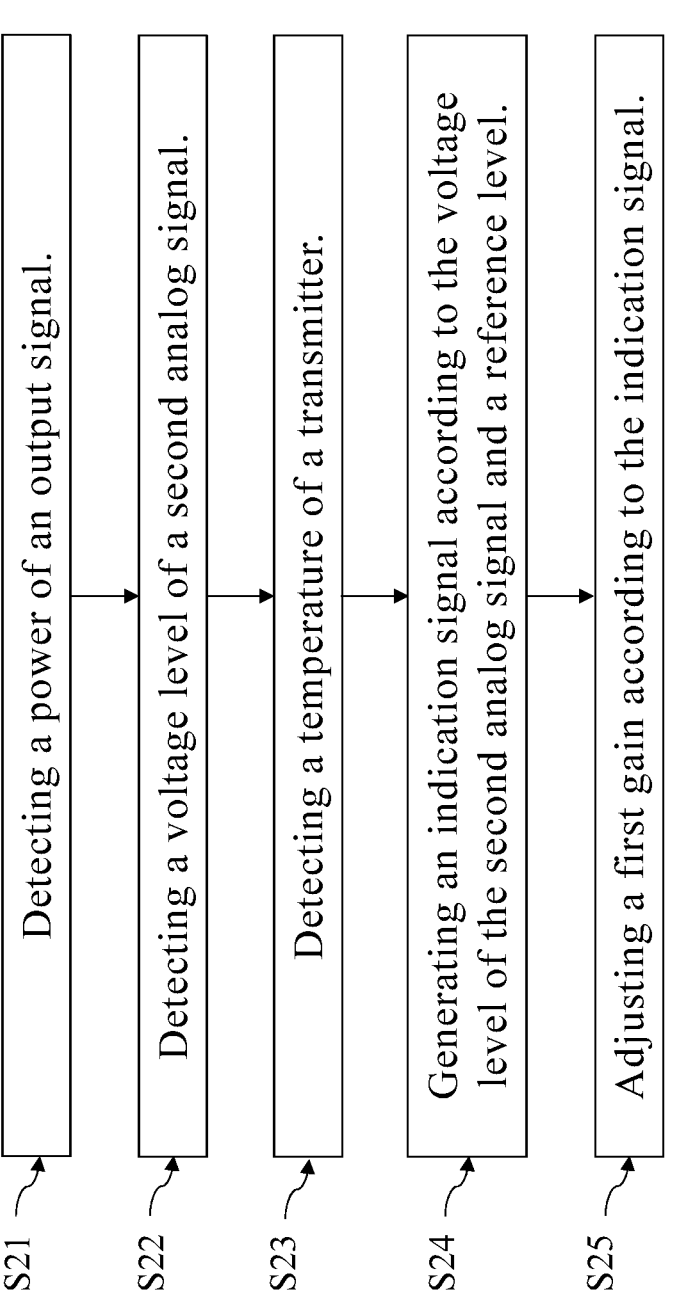
FIG. 2 is a flow chart of a gain control method according to some embodiments of the present disclosure.

Reference is made to FIG. 2. FIG. 2 is a flow chart of the gain control method 20 according to some embodiments of the present disclosure. In some embodiments, the transmitter 10 shown in FIG. 1 is used to perform the gain control method 20. For ease of understanding, the gain control method 20 is explained by referencing to the reference symbols in FIG. 1.

The gain control method 20 adjusts the gain G1 and gain G2 according to the voltage level Vsa2 of the analog signal SA2, the power Vout of the output signal Sout, and the temperature T of the transmitter 10, and includes Steps S21, S22, S23, S24, and S25.

In Step S21, the power Vout of the output signal Sout is detected. In Step S22, the voltage level Vsa2 of the analog signal SA2 (corresponding to the second analog signal) is detected. In Step S23, the temperature T of the transmitter 10 is detected. In Step S24, the indication signal Si is generated according to the voltage level Vas2 and the reference level Vr of the analog signal SA2. In Step S25, the gain G1 is adjusted according to the indication signal Si. As could be appreciated, the flow chart shown in FIG. 2 is only illustrative, and all operations described in FIG. 1 belong to the content of the gain control method 20.

The foregoing outlines features of several embodiments of the present application so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transmitter, comprising:
an analog transmission circuit, configured to provide a first gain to a first analog signal so as to generate a second analog signal;
a power amplifier, configured to provide a second gain to the second analog signal so as to generate an output signal to an antenna;
a voltage detector, configured to detect a voltage level of the second analog signal;
a comparator, configured to generate an indication signal according to the voltage level and a reference level; and
a control circuit, configured to adjust the first gain and the second gain according to the voltage level of the second analog signal, a power of the output signal, and the indication signal,
wherein when the voltage level is greater than the reference level, the indication signal has a first level, configured to indicate the control circuit to decrease the first gain.

2. The transmitter of claim 1, further comprising:
a power detector, configured to detect the power of the output signal.

3. The transmitter of claim 2, wherein when the power is not greater than a threshold power, and the voltage level is not greater than the reference level, the indication signal has a second level, configured to indicate the control circuit to increase the first gain.

4. The transmitter of claim 1, further comprising:
a heat sensor, configured to detect a temperature of the transmitter,
wherein the control circuit is further configured to adjust the first gain according to the temperature.

5. The transmitter of claim 1, wherein the control circuit is further configured to adjust the first gain according to a modulation method of the output signal.

6. A gain control method, configured to control a first gain of an analog transmission circuit and a second gain of a power amplifier in a transmitter, wherein the analog transmission circuit provides the first gain to a first analog signal so as to generate a second analog signal, and the power amplifier provides the second gain to the second analog signal so as to generate an output signal, the gain control method comprising:
adjusting the first gain and the second gain according to a voltage level of the second analog signal, a power of the output signal and a temperature of the transmitter, comprising:
generating an indication signal according to the voltage level and a reference level; and
adjusting the first gain according to the indication signal,
wherein the output signal is outputted through an antenna of the transmitter.

7. The gain control method of claim 6, wherein the step of adjusting the first gain and the second gain according to the voltage level of the second analog signal, the power of the output signal and the temperature of the transmitter further comprises:
detecting the voltage level of the second analog signal; and
detecting the power of the output signal.

8. The gain control method of claim 7, wherein the step of adjusting the first gain and the second gain according to the voltage level of the second analog signal, the power of the output signal and the temperature of the transmitter further comprises:
detecting the temperature of the transmitter.

9. The gain control method of claim 8, wherein the step of adjusting the first gain according to the indication signal comprises:
determining an initial value of a pre-determined power upper limit of the first analog signal;
obtaining a peak power of the first analog signal;
determining whether to update the initial value of the pre-determined power upper limit according to the indication signal; and
adjusting the first gain according to the pre-determined power upper limit, the power and the temperature.

10. The gain control method of claim 9, wherein when the voltage level is greater than the reference level, the indication signal has a first level, and when the voltage level is not greater than the reference level, the indication signal has a second level.

11. The gain control method of claim 10, wherein the step of determining whether to update the pre-determined power upper limit according to the indication signal comprises:
determining to update the initial value of the pre-determined power upper limit to be the peak power when the indication signal has the first level; and

determining not to update the initial value of the pre-determined power upper limit when the indication signal has the second level.

12. The gain control method of claim 10, wherein the step of adjusting the first gain according to the pre-determined power upper limit, the power and the temperature comprises:

when the power is not greater than a threshold power, and the indication signal has the second level, increasing the first gain.

13. The gain control method of claim 12, wherein when the power is not greater than the threshold power, and the indication signal has the second level, the gain control method further comprises:

increasing the second gain.

14. The gain control method of claim 9, wherein the step of adjusting the first gain according to the indication signal further comprises:

resetting the initial value of the pre-determined power upper limit when a change of the temperature is greater than a pre-determined range.

15. The gain control method of claim 9, wherein in the step of adjusting the first gain according to the pre-determined power upper limit, the power and the temperature, decreasing the first gain when the power is greater than a threshold power.

16. The gain control method of claim 15, wherein when the power is greater than the threshold power, the gain control method further comprises:

decreasing the second gain.

17. The gain control method of claim 15, wherein the first gain is decreased by about 7 dB.

18. The gain control method of claim 6, wherein in the step of adjusting the first gain and the second gain according to the voltage level of the second analog signal, the power of the output signal and the temperature of the transmitter, the first gain and the second gain are adjusted further according to a modulation method of the output signal.

*  *  *  *  *